United States Patent
Lee et al.

(10) Patent No.: US 9,023,462 B2
(45) Date of Patent: May 5, 2015

(54) THERMALLY CONDUCTIVE POLYMER COMPOSITE MATERIAL AND AN ARTICLE COMPRISING SAME

(75) Inventors: Youn Eung Lee, Daejeon (KR); Jin Kyu Lee, Busan (KR); Young Taek Oh, Seoul (KR); Mahn Jong Kim, Daejeon (KR)

(73) Assignee: Shenzhen Wote Advanced Materials Co., Ltd., Shenzhen (CN)

( * ) Notice: Subject to any disclaimer, the term of this patent is extended or adjusted under 35 U.S.C. 154(b) by 0 days.

(21) Appl. No.: 14/005,939

(22) PCT Filed: Nov. 28, 2011

(86) PCT No.: PCT/KR2011/009102
§ 371 (c)(1), (2), (4) Date: Sep. 18, 2013

(87) PCT Pub. No.: WO2012/138033
PCT Pub. Date: Oct. 11, 2012

(65) Prior Publication Data
US 2014/0227492 A1    Aug. 14, 2014

(30) Foreign Application Priority Data

Apr. 6, 2011    (KR) .................... 10-2011-0031795

(51) Int. Cl.
| | |
|---|---|
| B32B 3/00 | (2006.01) |
| C08K 3/38 | (2006.01) |
| C08K 7/14 | (2006.01) |
| C08K 3/00 | (2006.01) |
| C08K 3/04 | (2006.01) |
| C08K 3/08 | (2006.01) |
| C08K 3/40 | (2006.01) |
| H05K 1/03 | (2006.01) |

(52) U.S. Cl.
CPC ................ C08K 3/38 (2013.01); *H05K 1/0366* (2013.01); *H05K 1/0373* (2013.01); *H05K 1/0393* (2013.01); *H05K 2201/0141* (2013.01); *H05K 2201/0209* (2013.01); *C08K 7/14* (2013.01); *C08K 3/0033* (2013.01); *C08K 2201/001* (2013.01); *C08K 3/04* (2013.01); *C08K 3/08* (2013.01); *C08K 3/40* (2013.01); *C08K 2003/0812* (2013.01); *C08K 2003/382* (2013.01); *H05K 1/0353* (2013.01); *C08K 3/0008* (2013.01); *C08K 2003/385* (2013.01)

(58) Field of Classification Search
CPC ........................................................ C08L 67/00
USPC ............. 428/480; 252/299.6, 299.64, 299.65, 252/299.66
See application file for complete search history.

(56) References Cited

U.S. PATENT DOCUMENTS 7,824,572 B2 *  11/2010  Okamoto ................. 252/299.01
8,465,670 B2 *  6/2013  Kondo et al. ............ 252/299.01

FOREIGN PATENT DOCUMENTS

| | | | |
|---|---|---|---|
| JP | 2010037474 A | | 2/2010 |
| KR | 1020070096829 A | | 10/2007 |
| KR | 1020080009643 A | | 1/2008 |
| KR | 1020090041081 A | | 4/2009 |
| KR | 1020090045041 A | | 5/2009 |
| KR | 1020100135542 A | | 12/2010 |

OTHER PUBLICATIONS

International Search Report for International Application No. PCT/KR2011/009102 dated Jun. 28, 2012.
Written Opinion for International Application No. PCT/KR2011/009102 dated Jun. 28, 2012.

* cited by examiner

*Primary Examiner* — Elizabeth Mulvaney
(74) *Attorney, Agent, or Firm* — Osha Liang LLP

(57) ABSTRACT

A thermally conductive polymer composite material and an article including the same. The thermally conductive polymer composite material includes 15 to 20 parts by weight of a wholly aromatic liquid crystalline polyester resin; and 80 to 85 parts by weight of a thermally conductive additive.

11 Claims, No Drawings

THERMALLY CONDUCTIVE POLYMER COMPOSITE MATERIAL AND AN ARTICLE COMPRISING SAME

TECHNICAL FIELD

The present invention relates to a thermally conductive polymer composite material and an article including the same, and more particularly, to a thermally conductive polymer composite material including a wholly aromatic liquid crystalline polyester resin and a thermally conductive additive, and an article including the same.

BACKGROUND ART

Due to demand for smaller and thinner electronic devices, a heating element, such as an electronic part installed in an electronic device, is densely installed in a small space, and due to high sealingness of the electronic device, electronic parts installed inside the electronic device are readily exposed to heat. Once electronic parts are exposed to heat for a long time, their performance may be degraded and lifetimes thereof are also shortened.

The problems described above can be addressed by using, typically, a heat dissipating device that emits heat to the outside to reduce an amount of heat affecting electronic parts. As a material for the heat dissipating device, metal, graphite, carbon, or the like may be used. However, these materials may not be directly connected to electronic devices due to their strength and limitations on a molded shape.

As an alternative to the heat dissipating device, a thermally conductive material may be used as a material for electronic parts. As the thermally conductive material, metal may be used. However, a metal material has low productivity and has poor moldability due to its limitation on part design. Also the metal material is inappropriate for manufacturing lightweight electronic devices.

Accordingly, a study for a thermally conductive polymer that is injection-moldable and due to this property, provides high productivity and enables a precise design has been carried out. However, because the thermally conductive polymer typically has a thermal conductivity of 0.5 W/mK or less, it is impossible to use the thermally conductive polymer itself as an alternative to metal.

Accordingly, recently, a polymer composite material that includes an additive for increasing the thermal conductivity has been studied. For example, KR 2009-0041081 discloses a thermally conductive resin composite material including polyphenylene sulfide (PPS) as a crystalline polymer resin, a mixed metal filler, and a low melting point metal. However, if an amount of the PPS exceeds 85 vol % in the thermally conductive resin composite material, flowability of PPS is decreased and thus an injection molding process thereof is difficult to be performed. Also, PPS is not smoothly mixed with other elements and it is difficult to secure a predetermined level or more of thermal conductivity which is appropriate for actual use environments requiring the thermal conductivity. Also, if an amount of the PPS is less than 30 vol % in the thermally conductive resin composite material, it is difficult to manufacture a composite material itself. The thermal conductive resin composite material has a thermal conductivity of 3.5 W/mK or less even under optimal conditions. Thus, this thermal conductivity level is lower than 10 W/mK, a level at which a thermally conductive polymer material can replace metal.

Thus, up to now, only metal materials are used as a material for electronic parts requiring high thermal conductivity

DETAILED DESCRIPTION OF THE INVENTION

Technical Problem

The present invention provides a thermally conductive polymer composite material including a wholly aromatic liquid crystalline polyester resin and a thermally conductive additive.

The present invention also provides an article including the thermally conductive polymer composite material.

Technical Solution

According to an aspect of the present invention, there is provided a thermally conductive polymer composite material including: 15 to 20 parts by weight of a wholly aromatic liquid crystalline polyester resin; and 80 to 85 parts by weight of a thermally conductive additive.

The thermally conductive polymer composite material may further include 5 to 50 parts by weight of a reinforcing agent based on 100 parts by weight of a total amount of the wholly aromatic liquid crystalline polyester resin and the thermally conductive additive.

The reinforcing agent may include glass fiber, wollastonite, dolomite, quartz, magnesium hydroxide, aluminum hydroxide, barium sulfate, mica, calcium carbonate, talc, carbon fiber, aramid fiber, boron fiber, or a combination thereof.

The wholly aromatic liquid crystalline polyester resin may include a repeating unit derived from a hydroxy benzoic acid and a repeating unit derived from a hydroxy naphthoic acid and may not include a repeating unit derived from an aromatic dicarboxylic acid.

The hydroxy benzoic acid may include para-hydroxybenzoic acid, 3-hydroxy benzoic acid, 2-hydroxy benzoic acid, or a combination thereof.

The hydroxy naphthoic acid may include 6-hydroxy-2-naphthoic acid, 3-hydroxy-2-naphthoic acid, 2-hydroxy-1-naphthoic acid, 1-hydroxy-2-naphthoic acid, or a combination thereof.

The wholly aromatic liquid crystalline polyester resin may include 70 to 80 parts by mole of the repeating unit derived from the hydroxy benzoic acid and 20 to 30 parts by mole of the repeating unit derived from the hydroxy naphthoic acid.

The thermally conductive additive may include a thermal conductivity of 20 W/mK or more.

The thermally conductive additive may include graphite, alumina, aluminum, boron nitride, silicon nitride, copper, silver, aluminum nitride, carbon nanotubes, or a combination thereof.

The thermally conductive polymer composite material may have a thermal conductivity of 10 W/mK or more.

According to another aspect of the present invention, there is provided an article comprising the thermally conductive polymer composite material.

The article may be a printed circuit board.

Advantageous Effects

A thermally conductive polymer composite material according to the present invention includes a wholly aromatic liquid crystalline polyester resin. Due to the inclusion of the wholly aromatic liquid crystalline polyester resin, the thermally conductive polymer composite material may include 80 wt % or more of additives, which is impossible in the case of a conventional polymer composite material. Also, the thermal conductivity of the thermally conductive polymer composite material is three times or more greater than that of a conventional PPS composite material.

Also, a thermally conductive polymer composite material according to the present invention has a flexural strength and flexural modulus which are comparable to those of a PPS composite material that includes a relatively low additive content, although the thermally conductive polymer composite material includes a considerably high additive content.

Also, a thermally conductive polymer composite material according to the present invention has a thermal conductivity of 10 W/mK or more, which is a level of thermal conductivity level required for replacing metal. Thus, the thermally conductive polymer composite material can replace a metal material as an electronic part material, such as a substrate material, required to have high thermal conductivity.

MODE OF THE INVENTION

Hereinafter, a thermally conductive polymer composite material according to the present invention will be described in detail.

The thermally conductive polymer composite material includes 15 to 20 parts by weight of a wholly aromatic liquid crystalline polyester resin and 80 to 85 parts by weight of a thermally conductive additive, based on 100 parts by weight of the total amount of the thermally conductive polymer composite material.

The thermally conductive polymer composite material may include a repeating unit derived from a hydroxy benzoic acid and a repeating unit derived from a hydroxy naphthoic acid and may not include a repeating unit derived from an aromatic dicarboxylic acid.

The thermally conductive polymer composite material is not deformed and discolored due to inherent characteristics of the wholly aromatic liquid crystalline polyester resin as a major raw material even when exposed to heat for a long time and thus, has high durability. Also, an article including the thermally conductive polymer composite material has excellent thermal resistance and thus a prolonged lifetime.

The wholly aromatic liquid crystalline polyester resin may include 70 to 80 parts by mole of the repeating unit derived from the hydroxy benzoic acid and 20 to 30 parts by mole of the repeating unit derived from the hydroxy naphthoic acid. If the amounts of the repeating unit derived from the hydroxy benzoic acid and the repeating unit derived from the hydroxy naphthoic acid are respectively within these ranges, the wholly aromatic liquid crystalline polyester resin is easily manufactured, maintains high thermal resistance even at high temperature, and has high physical strength. Also, when the wholly aromatic liquid crystalline polyester resin is injection molded, releasing from a mold, breaking, and dust generation may less likely to occur during the injection molding. Thus, the wholly aromatic liquid crystalline polyester resin has excellent injection molding properties.

The wholly aromatic liquid crystalline polyester resin may be prepared through the following processes:

(a) synthesizing a wholly aromatic liquid crystalline polyester prepolymer by condensation-polymerizing one or more monomers; and (b) solid-phase condensation-polymerizing the wholly aromatic liquid crystalline polyester prepolymer to synthesize the wholly aromatic liquid crystalline polyester resin.

The monomers used in process (a) include a hydroxy benzoic acid selected from the group consisting of para-hydroxy-benzoic acid, 3-hydroxy benzoic acid, 2-hydroxy benzoic acid, and a combination thereof; and a hydroxy naphthoic acid selected from the group consisting of 6-hydroxy-2-naphthoic acid, 3-hydroxy-2-naphthoic acid, 2-hydroxy-1-naphthoic acid, 1-hydroxy-2-naphthoic acid and a combination thereof; and does not include an aromatic dicarboxylic acid, such as isophthalic acid, 2,6-naphthalene dicarboxylic acid, telephthalic acid, and phthalic acid. The monomers used in process (a) may further include aromatic diol, aromatic diamine, aromatic amine having a phenolic hydroxyl group, an aromatic amino carboxylic acid, or a combination thereof.

Also, during the synthesizing of the wholly aromatic liquid crystalline polyester prepolymer, metal acetate may further be used as a catalyst for facilitating a reaction. The metal acetate catalyst may include at least one selected from the group consisting of a magnesium acetate, a potassium acetate, a calcium acetate, a zinc acetate, a manganese acetate, a lead acetate, an antimony acetate, and a cobalt acetate. An amount of the metal acetate catalyst may be, for example, 0.10 parts by weight or less based on 100 parts by weight of the total amount of the monomers.

As the synthesis method used in process (a), solution condensation polymerization or bulk condensation polymerization may be used. In addition, a monomer (i.e., acylated monomer) that has reactivity enhanced by pre-treatment with chemicals such as an acylating agent (particularly, acetylating agent) may be used in step (a) in order to facilitate the condensation polymerization.

To perform the solid-phase condensation polymerization in process (b), an appropriate amount of heat needs to be applied to the prepolymer, and as a heat supply method, a method using a heating plate, a method using hot air, a method using high-temperature fluids, or the like may be used. By-products generated during the solid-phase condensation polymerization may be removed either by purging the reactor with an inert gas or by applying vacuum thereto.

Also, the wholly aromatic liquid crystalline polyester resin may include various repeating units in its chain, and may include, for example, the following repeating units:

(1) a repeating unit derived from an aromatic hydroxy carboxylic acid:

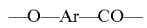

(2) a repeating unit derived from an aromatic diol:

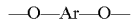

(3) a repeating unit derived from an aromatic diamine:

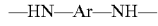

(4) a repeating unit derived from an aromatic amine having a phenolic hydroxyl group:

(5) a repeating unit derived from an aromatic amino carboxylic acid:

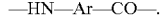

In the formulae defined above, Ar may be phenylene, biphenylene, naphthalene, an aromatic compound in which two phenylenes are bonded to each other via carbon or a non-carbon element, or an aromatic compound selected from the group consisting of phenylene, biphenylene, naphthalene, and two phenylenes bonded to each other via carbon or a non-carbon element in which at least one hydrogen atom is substituted with other elements.

If the amount of the wholly aromatic liquid crystalline polyester resin is less than 15 parts by weight based on 100 parts by weight of the total amount of the thermally conductive polymer composite material, an injection molded product has poor binding force and thus easily breaks. On the other hand, if the amount of the wholly aromatic liquid crystalline polyester resin is greater than 20 parts by weight based on 100 parts by weight of the total amount of the thermally conductive polymer composite material, the improvement effect of thermal conductivity may be insufficient.

The thermally conductive additive may contribute to an increase in the thermal conductivity of the thermally conductive polymer composite material.

The thermally conductive additive may have a thermal conductivity of 20 W/mK or more (for example, 20 to 500 W/mK). If the thermal conductivity of the thermally conductive additive is 20 W/mK or more, even when the thermally conductive additive is added in a small amount, the sufficient improvement effect thermal conductivity may be obtained.

The thermally conductive additive may include graphite, alumina, aluminum, boron nitride, silicon nitride, copper, silver, aluminum nitride, carbon nanotubes, or a combination thereof. The alumina may be spherical, and the aluminum may have a fibrous- or tabular-shape.

If the amount of the thermally conductive additive is less than 80 parts by weight based on 100 parts by weight of the total amount of the thermally conductive polymer composite material, the improvement effect of thermal conductivity may be negligible, and if the amount of the thermally conductive additive is greater than 85 parts by weight based on 100 parts by weight of the total amount of the thermally conductive polymer composite material, it is difficult to manufacture an injection-molded product (that is, a thermally conductive polymer composite material), and flexural strength and flexural modulus of the injection-molded product may be rapidly decreased.

The thermally conductive polymer composite material may further include 5 to 50 parts by weight of a reinforcing agent based on 100 parts by weight of the total amount of the wholly aromatic liquid crystalline polyester resin and the thermally conductive additive The reinforcing agent may increase mechanical strength of the thermally conductive polymer composite material without a significant decrease in the thermal resistance and thermal conductivity thereof, and may maintain the shape of an injection-molded product.

If the amount of the reinforcing agent is within this range, a supporting force that is supportable to the structure of an injection-molded product including the reinforcing agent is sufficiently provided and thus the yield of the injection-molded product is high; flexural modulus is appropriate and thus the formed injection-molded product may not break; the reinforcing agent may be well dispersed in the injection-molded product and thus the injection-molded product may be efficiently manufactured; and has a uniform strength.

The reinforcing agent may include glass fiber, wollastonite, dolomite, quartz, magnesium hydroxide, aluminum hydroxide, barium sulfate, mica, calcium carbonate, talc, carbon fiber, aramid fiber, boron fiber, or a combination thereof.

The thermally conductive polymer composite material may have a thermal conductivity of 10 W/mK or more (for example, 14 to 20 W/mK). If the thermal conductivity of the thermally conductive additive is 10 W/mK or more, a thermally conductive polymer composite material that can replace a metal material for an electronic part requiring high thermal conductivity can be obtained.

The thermally conductive polymer composite material may be a resin compound that is prepared by mixing the wholly aromatic liquid crystalline polyester resin, the thermally conductive additive, and selectively, the reinforcing agent, or the like at a predetermined ratio, followed by melt-kneading and drying.

The melt-kneading may be performed using a batch type kneader, a twin screw extruder, a mixing roller, or the like. Also, during melt-kneading, a lubricant, such as a fluoro-based lubricant, may be used to smoothly perform melt-kneading.

The resin compound may be injection-molded into a circular or tabular article having a thickness of 0.1 mm to 100 mm by using a pressure-control type or a speed-control type injection molding machine. During the injection-molding, the resin compound may be injection-molded into a frame or sole injection-molded. An injection-molded product formed as described above may be used as a material for an electronic part, such as a printed circuit board.

Hereinafter, the present invention will be further described with examples. However, the present invention is not limited to the examples.

EXAMPLES

Example 1

Preparation Example 1

Preparation of Wholly Aromatic Liquid Crystalline Polyester Resin 3.018 kg of a para-hydroxybenzoic acid, 1.300 kg of a 6-hydroxy-2-naphthoic acid, and 0.3 g of a potassium acetate (catalyst) were fed into a 10 L batch-type reactor that is temperature-controllable, and a nitrogen gas was added thereto to make the inner space of the reactor be in an inert state, and then 3.024 kg of acetic anhydride was further added thereto. Then, the temperature of the reactor was increased to 150° over 30 minutes and then at this temperature, hydroxyl groups of the monomers were acetylated for 2 hours. Then, while removing acetic acids produced during the acetylation reaction, the temperature of the reactor was increased to 320° over 5 hours and 20 minutes and then was maintained for 20 minutes, thereby obtaining a wholly aromatic liquid crystalline polyester prepolymer through condensation polymerization of the monomers. Also, when the prepolymer was formed, an acetic acid was further produced as a by-product, and the acetic acid was also continuously removed together with the acetic acid that had been produced during the acetylating reaction. Then, the prepolymer was collected from the reactor and solidified by cooling.

Thereafter, the wholly aromatic liquid crystalline polyester prepolymer was milled into particles having an average particle size of 1 mm, and then 3 kg of the milled wholly aromatic liquid crystalline polyester prepolymer was fed into a 10 L rotary kiln reactor. Then, while a nitrogen gas was supplied into the reactor at a flow rate of 1 $Nm^3$/hour, the temperature was increased to 200° at which a weight loss is initiated over 1 hour, and then the temperature was increased to 290° over 6 hours and then was maintained for 5 hours to prepare a wholly aromatic liquid crystalline polyester resin. Then, the reactor was cooled to room temperature over one hour and then, the wholly aromatic liquid crystalline polyester resin was collected from the reactor.

Preparation Example 2

Preparation of Wholly Aromatic Liquid Crystalline Polyester Resin Compound

The wholly aromatic liquid crystalline polyester resin prepared according to Preparation Example 1, glass fiber (Seongjin Fiber, MF150 W-AC) having a length distribution of 100 to 300 μm, an average length of 150 μm, and a diameter of 10±1 μm, aluminum (Cerakor Co., Ltd., Al200, thermal conductivity: 200 W/mK), and boron nitride (Cerakor Co., Ltd., CB30, thermal conductivity: 120 W/mK) were mixed at a weight ratio of 15:5:60:20 using a batch-type mixer (product of JEIL INDUSTRY DEVICE company) for 30 minutes. Then, the mixture was dried using an oven dryer (product of A-SUNG PLANT company) at a temperature of 1300 for 4 hours or more to decrease the water content to 200 wtppm or lower therein, and then melt-kneaded by using a twin screw extruder (L/D: 40, diameter: 25 mm) while being fed thereto at a supply rate of 10 kg per hour, thereby preparing a wholly aromatic liquid crystalline polyester resin compound. To remove gas and by-product produced during the melt-kneading, one open vent unit and one vacuum vent unit were respectively installed on No. 3 barrel unit and No. 7 barrel unit of the twin screw extruder. The prepared wholly aromatic liquid crystalline polyester resin compound was cooled and dehydrated by using a cooling equipment (SEAWON M-TECH, mesh conveyor belt) and then pelletized. Then, the pellets of the wholly aromatic liquid crystalline polyester resin compound were dried using an automatic drier (product of JEIL INDUSTRY DEVICE) for two hours and mixed.

Example 2

A wholly aromatic liquid crystalline polyester resin compound was prepared in the same manner as in Example 1, except that the weight ratio of the wholly aromatic liquid crystalline polyester resin prepared according to Preparation Example 1 of Example 1, glass fiber, aluminum, and boron nitride was 15:5:80:0.

Example 3

A wholly aromatic liquid crystalline polyester resin compound was prepared in the same manner as in Example 1, except that the weight ratio of the wholly aromatic liquid crystalline polyester resin prepared according to Preparation Example 1 of Example 1, glass fiber, aluminum, and boron nitride was 15:5:0:80.

Example 4

A wholly aromatic liquid crystalline polyester resin compound was prepared in the same manner as in Example 1, except that a mixture was prepared by mixing the wholly aromatic liquid crystalline polyester resin prepared according to Preparation Example 1 of Example 1 and graphite at a weight ratio of 15:85 and then the mixture was used (that is, glass fiber, aluminum, and boron nitride were not used).

Comparative Example 1

A polyphenylene sulfide (PPS) resin compound was prepared in the same manner as in Example 1, except that a mixture was prepared by mixing PPS, aluminum, and boron nitride at a weight ratio of 60:20:20 and then the mixture was used (that is, the wholly aromatic polyester resin and glass fiber were not used).

Comparative Example 2

A PPS resin compound was prepared in the same manner as in Example 1, except that a mixture was prepared by mixing PPS and aluminum at a weight ratio of 60:40 and then the mixture was used (that is, the wholly aromatic polyester resin, glass fiber, and boron nitride were not used)

Comparative Example 3

A PPS resin compound was prepared in the same manner as in Example 1, except that a mixture was prepared by mixing PPS and boron nitride at a weight ratio of 60:40 and then the mixture was used (that is, the wholly aromatic polyester resin, glass fiber, and aluminum were not used)

Evaluation Example

The resin compounds prepared according to Examples 1 to 4 and Comparative Examples 1 to 3 were each dried by using an oven dryer (product of A-SUNG PLANT) at a temperature of 130° for 4 hours or more to decrease a water content to 200 wtppm or lower therein, and then fed into an electrical injection molding machine (Sodick company, TR30EH2) to prepare a discus-shaped sample having a diameter of 1 inch (that is, injection-molded product). Then, the thermal conductivity, flexural modulus, and flexural strength of each of the samples were measured by using the methods as described below, and results thereof are shown in Table 2 below.

(Thermal Conductivity)
The thermal conductivity of each of the samples was measured by using a thermal conductivity measurement device (Anter Corporation, UNITHERM™ 2022).
(Flexural Modulus and Flexural Strength)
The flexural modulus and flexural strength of each of the samples was measured according to ASTM D790.

TABLE 1

|  | Thermal conductivity (W/mK) | Flexural modulus (MPa) | Flexural strength (MPa) |
| --- | --- | --- | --- |
| Example 1 | 14.12 | 10600 | 55 |
| Example 2 | 14.01 | 9000 | 62 |
| Example 3 | 14.21 | 14000 | 50 |
| Example 4 | 18.01 | 6500 | 38 |
| Comparative Example 1 | 3.70 | 12100 | 81 |
| Comparative Example 2 | 3.72 | 12300 | 85 |
| Comparative Example 3 | 3.66 | 12400 | 83 |

Referring to Table 1, the thermal conductivity of the injection-molded products (that is, sample) of the aromatic liquid crystalline polyester resin compounds prepared according to Examples 1 to 3 is three times or more greater than that of the injection-molded products of the PPS resin compounds prepared according to Comparative Examples 1 to 3, and also, the flexural modulus and flexural strength of the injection-molded products of the aromatic liquid crystalline polyester resin compounds prepared according to Examples 1 to 3 were similar to or a little lower than those of the injection-molded products of the PPS resin compounds prepared according to Comparative Examples 1 to 3. Such a large thermal conductivity difference may be due to different molecular chain structures of the wholly aromatic liquid crystalline polyester resin and PPS. That is, the molecular chain of the wholly aromatic liquid crystalline polyester resin is linearly oriented unlike that of the molecular chain of PPS, and thus, functions as a heat conducting path. Also, because injection-molded product (that is, a sample) of the wholly aromatic liquid crystalline polyester resin compound prepared according to Example 4 did not include a reinforcing agent, such as glass fiber, its flexural modulus and flexural strength were very low although its thermal conductivity is four times or more greater than the thermal conductivity of the injection-molded products of the PPS resin compounds prepared according to Comparative Examples 1 to 3.

A thermally conductive polymer composite material according to the present invention includes a wholly aromatic liquid crystalline polyester resin. Due to the inclusion of the wholly aromatic liquid crystalline polyester resin, the thermally conductive polymer composite material may include 80 wt % or more of additives, which is impossible in the case of a conventional polymer composite material. Also, the thermal conductivity of the thermally conductive polymer composite material is three times or more greater than that of a conventional PPS composite material.

Also, a thermally conductive polymer composite material according to the present invention has a flexural strength and flexural modulus which are comparable to those of a PPS composite material that includes a relatively low additive content, although the thermally conductive polymer composite material includes a considerably high additive content.

Also, a thermally conductive polymer composite material according to the present invention has a thermal conductivity of 10 W/mK or more, which is a level of thermal conductivity level required for replacing metal. Thus, the thermally conductive polymer composite material can replace a metal material as an electronic part material, such as a substrate material, required to have high thermal conductivity.

While the present invention has been particularly shown and described with reference to exemplary embodiments thereof, it will be understood by those of ordinary skill in the art that various changes in form and details may be made therein without departing from the spirit and scope of the present invention as defined by the following claims.

The invention claimed is:

1. A thermally conductive polymer composite material comprising:
   15 to 20 parts by weight of a wholly aromatic liquid crystalline polyester resin; and
   80 to 85 parts by weight of a thermally conductive additive, wherein the wholly aromatic liquid crystalline polyester resin comprises a repeating unit derived from a hydroxy benzoic acid and a repeating unit derived from a hydroxy naphthoic acid and does not comprise a repeating unit derived from an aromatic dicarboxylic acid.

2. The thermally conductive polymer composite material of claim 1, further comprising 5 to 50 parts by weight of a reinforcing agent based on 100 parts by weight of a total amount of the wholly aromatic liquid crystalline polyester resin and the thermally conductive additive.

3. The thermally conductive polymer composite material of claim 2, wherein the reinforcing agent comprises glass fiber, wollastonite, dolomite, quartz, magnesium hydroxide, aluminum hydroxide, barium sulfate, mica, calcium carbonate, talc, carbon fiber, aramid fiber, boron fiber, or a combination thereof.

4. The thermally conductive polymer composite material of claim 1, wherein the hydroxy benzoic acid comprises para-hydroxybenzoic acid, 3-hydroxy benzoic acid, 2-hydroxy benzoic acid, or a combination thereof.

5. The thermally conductive polymer composite material of claim 1, wherein the hydroxy naphthoic acid comprises 6-hydroxy-2-naphthoic acid, 3-hydroxy-2-naphthoic acid, 2-hydroxy-1-naphthoic acid, 1-hydroxy-2-naphthoic acid, or a combination thereof.

6. The thermally conductive polymer composite material of claim 1, wherein the wholly aromatic liquid crystalline polyester resin comprises 70 to 80 parts by mole of the repeating unit derived from the hydroxy benzoic acid and 20 to 30 parts by mole of the repeating unit derived from the hydroxy naphthoic acid.

7. The thermally conductive polymer composite material of claim 1, wherein the thermally conductive additive comprises a thermal conductivity of 20 W/mK or more.

8. The thermally conductive polymer composite material of claim 1, wherein the thermally conductive additive comprises graphite, alumina, aluminum, boron nitride, silicon nitride, copper, silver, aluminum nitride, carbon nanotubes, or a combination thereof.

9. The thermally conductive polymer composite material of claim 1, wherein the thermally conductive polymer composite material has a thermal conductivity of 10 W/mK or more.

10. An article comprising the thermally conductive polymer composite material of claim 1.

11. An article of claim 10, wherein the article is a printed circuit board.

* * * * *